US009900582B2

United States Patent
Vandame et al.

(10) Patent No.: US 9,900,582 B2
(45) Date of Patent: Feb. 20, 2018

(54) PLENOPTIC FOVEATED CAMERA

(71) Applicant: THOMSON LICENSING, Issy les Moulineaux (FR)

(72) Inventors: Benoit Vandame, Betton (FR); Thierry Borel, Rennes (FR); Louis Chevallier, La Meziere (FR)

(73) Assignee: Thomson Licensing, Issy-les-Moulineaux (FR)

(*) Notice: Subject to any disclaimer, the term of this patent is extended or adjusted under 35 U.S.C. 154(b) by 0 days.

(21) Appl. No.: 15/198,643

(22) Filed: Jun. 30, 2016

(65) Prior Publication Data

US 2017/0006278 A1   Jan. 5, 2017

(30) Foreign Application Priority Data

Jun. 30, 2015   (EP) .................................... 15306053

(51) Int. Cl.
| | |
|---|---|
| H04N 13/02 | (2006.01) |
| H01L 27/146 | (2006.01) |
| G02B 3/00 | (2006.01) |
| H04N 5/225 | (2006.01) |
| H04N 5/357 | (2011.01) |

(52) U.S. Cl.
CPC ....... *H04N 13/0257* (2013.01); *G02B 3/0056* (2013.01); *H01L 27/14621* (2013.01); *H04N 5/2254* (2013.01); *H04N 5/3572* (2013.01); *H04N 13/0207* (2013.01)

(58) Field of Classification Search
CPC .. G02B 3/0006; G02B 3/0037–3/0056; H04N 13/0037; H04N 13/0257; H04N 13/0282; H04N 5/2254; H04N 5/2258; H04N 5/247; H01L 27/14621
See application file for complete search history.

(56) References Cited

U.S. PATENT DOCUMENTS

| | | | |
|---|---|---|---|
| 5,506,619 | A | 4/1996 | Adams et al. |
| 6,882,364 | B1 | 4/2005 | Inuiya et al. |
| 8,228,417 | B1 | 7/2012 | Georgiev et al. |
| 2006/0088298 | A1* | 4/2006 | Frame ................... H04N 5/332 386/227 |

(Continued)

FOREIGN PATENT DOCUMENTS

| | | |
|---|---|---|
| JP | 2009222850 | 10/2009 |
| JP | 2012257295 | 12/2012 |
| WO | WO2013169671 | 11/2013 |

OTHER PUBLICATIONS

Ng et al., "Light Field Photography with a Hand-held Plenoptic Camera", Stanford Tech Report CTSR Feb. 2005, Stanford University, Feb. 2005.

(Continued)

*Primary Examiner* — Paul Berardesca
(74) *Attorney, Agent, or Firm* — Myers Wolin LLC

(57) ABSTRACT

A sensor 4 targeted to be mounted on a plenoptic camera comprises at least one microimage area targeted to sense a microimage refracted by a microlens array, the microimage area being at least partially covered by a color filter array, wherein the color saturation of the color filter array decreases when getting away from a centroid $(x_{i,j}, y_{i,j})$ of the microimage area.

8 Claims, 7 Drawing Sheets

(56) References Cited

U.S. PATENT DOCUMENTS

| | | | |
|---|---|---|---|
| 2007/0076269 A1* | 4/2007 | Kido | H04N 5/23245 358/474 |
| 2007/0272836 A1* | 11/2007 | Higashitsutsumi | G01J 3/36 250/226 |
| 2010/0277629 A1 | 11/2010 | Tanaka et al. | |
| 2010/0321542 A1* | 12/2010 | Koskinen | H01L 27/14621 348/273 |
| 2013/0222606 A1 | 8/2013 | Pitts et al. | |
| 2013/0222652 A1 | 8/2013 | Akeley et al. | |
| 2014/0146201 A1 | 5/2014 | Knight et al. | |
| 2015/0077618 A1 | 3/2015 | Ueno et al. | |

OTHER PUBLICATIONS

Georgiev et al., "Using Focused Plenoptic Cameras for Rich Image Capture", IEEE Computer Graphics and Applications, Jan./Feb. 2011, pp. 50-61.

* cited by examiner ically include the particular feature, structure, or char-
PLENOPTIC FOVEATED CAMERA This application claims the benefit, under 35 U.S.C. § 119 of European Patent Application No. 15306053.8, filed Jun. 30, 2015.

1. TECHNICAL FIELD

The field of the disclosure relates to light-field imaging. More particularly, the disclosure pertains to technologies for recording a colored light-field image.

More specifically, the disclosure relates to a Color Filter Array (CFA) targeted to be mounted on the sensor of a plenoptic camera.

2. BACKGROUND ART

This section is intended to introduce the reader to various aspects of art, which may be related to various aspects of the present disclosure that are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Conventional image capture devices render a three-dimensional scene onto a two-dimensional sensor. During operation, a conventional capture device captures a two-dimensional (2-D) image representing an amount of light that reaches each point on a sensor (or photo-detector) within the device. However, this 2-D image contains no information about the directional distribution of the light rays that reach the sensor (may be referred to as the light-field). Depth, for example, is lost during the acquisition. Thus, a conventional capture device does not store most of the information about the light distribution from the scene.

Light-field capture devices (also referred to as "light-field data acquisition devices") have been designed to measure a four-dimensional (4D) light-field of the scene by capturing the light from different viewpoints of that scene. Thus, by measuring the amount of light traveling along each beam of light that intersects the sensor, these devices can capture additional optical information (information about the directional distribution of the bundle of light rays) for providing new imaging applications by post-processing. The information acquired/obtained by a light-field capture device is referred to as the light-field data. Light-field capture devices are defined herein as any devices that are capable of capturing light-field data.

Light-field data processing comprises notably, but is not limited to, generating refocused images of a scene, generating perspective views of a scene, generating depth maps of a scene, generating extended depth of field (EDOF) images, generating stereoscopic images, and/or any combination of these.

Among the several existing groups of light-field capture devices, the "plenoptic device" or "plenoptic camera", embodies a microlens array positioned in the image focal field of the main lens, and before a sensor on which one microimage per microlens is projected. In the following description, the area of the sensor on which one (or several) microimage is targeted to be projected is referred to as "microimage area" or "sensor microimage" or "microimage of the sensor" or "exposed zone" or "zone of projection". The raw image of the scene obtained as a result is the sum of all the pixels of the sensor belonging to one sensor microimage and/or another. The angular information of the light-field is then given by the relative position of pixels in the microimage areas with respect to their center. Based on this raw image, the extraction of an image of the captured scene from a certain point of view, also called "demultiplexing", can be performed. The demultiplexing process can be seen as a data conversion from the 2D raw image to the 4D light-field. The resulting demultiplexed light-field data can be represented by a matrix of views in which all the views are horizontally and vertically aligned.

Regarding colors detection, pixels of a majority of sensors just record the quantity of visible photons passing through them, regardless their colors. In order to acquire a colored 4D light-field data, it is know from background art to mount a Color Filter Array (CFA) on top of the sensor. For instance, Bayer filters which cover 2 by 2 pixels with the three distinct colors Red (R) Green (G) Blue (B) located in the following order R, G, G, B within the 2 by 2 matrix, are commonly used as CFA. However, a skilled person will understand that the expression "Color Filter Array" as used in the following description does not only refer to Bayer filters but also to all the alternative CFA of the art.

One main drawback of this technology is that it is lowering the light sensitivity of the sensor, since at least half of the photons are blocked by the CFA. In addition, chromatic aberrations may occur on the edges of the sensor microimage and therefore affect the quality of the rendered image. In an attempt to solve these problems, patent document US2014/0146201A1 discloses a CFA that only covers a portion of a sensor microimage. However, it is not sufficient to improve the light sensitivity of the sensor.

It would hence be desirable to provide a sensor that shows improvements over the background art.

Notably, it would be desirable to provide such a sensor, which could feature a better light sensitivity, while keeping satisfactory color sensitivity and limiting the risk of chromatic aberration appearance.

3. SUMMARY OF THE DISCLOSURE

References in the specification to "one embodiment", "an embodiment", "an example embodiment", indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

In one particular embodiment of the technique, a sensor targeted to be mounted on a plenoptic camera is disclosed. The sensor comprises at least one microimage area targeted to sense a microimage refracted by a microlens array, the microimage area being at least partially covered by a color filter array. The color saturation of the color filter array decreases when getting away from a centroid of the microimage area.

In the following description, the expression "partially covered" refers to the position of the CFA compared to the sensor microimage (microimage area). In one embodiment, such CFA covers the totality of the sensor microimage. In another embodiment, the CFA only covers a portion of the sensor microimage, which either includes or not the centroid of the microimage area. Based on the distance between a point of the CFA to be considered and the centroid of the sensor microimage, the color saturation of this point is decreasing when this distance increases.

The decrease in color saturation of the CFA, when getting closer to the sensor microimage borders, allows capturing more photons than a CFA of the background art. Such a sensor therefore features an improved light sensitivity. In addition, since the pixels at the centroid are illuminated by photons that are less aberrated compared to photons passing by the main lens pupil border, such a sensor also allows limiting the risk of chromatic aberration appearance, while keeping at a satisfactory level its color sensitivity.

In one embodiment, the centroid of the color filter array corresponds to the centroid of the microimage area.

Due to the chromatic aberration phenomenon, the pixels at the centroid of the sensor microimages bring sharper details and colors than the pixels located at the border of the sensor microimage. Thus, for an equal value of CFA surface, positioning the CFA at the centroid of the sensor microimage allows improving the quality of the rendered microlens image.

According to an embodiment, the color saturation of the color filter array decreases from the centroid $(x_{i,j}, y_{i,j})$ of the microimage area to the border of the microimage area.

In one embodiment, the color saturation of the color filter array varies from 1, at the centroid of the microimage area, to 0, nearby the border of the microimage area.

In one embodiment, the CFA is a Bayer filter and the color components are given in HSV color space:

$$\begin{cases} R\left(0°, \max\left(1 - \frac{2(x - x_{i,j})}{p}, 1 - \frac{2(y - y_{i,j})}{p}\right), 1.0\right)_{HSV} \\ G\left(120°, \max\left(1 - \frac{2(x - x_{i,j})}{p}, 1 - \frac{2(y - y_{i,j})}{p}\right), 1.0\right)_{HSV} \\ B\left(240°, \max\left(1 - \frac{2(x - x_{i,j})}{p}, 1 - \frac{2(y - y_{i,j})}{p}\right), 1.0\right)_{HSV} \end{cases}$$

Where (x, y) are the coordinates of a pixel below the microlens (i,j), $(x_{i,j}, y_{i,j})$ are the coordinates of the centroid of the microlens image area and p is the distance between the respective centroids of two adjacent microimage areas.

Such a smooth variation in saturation from the centroid $(x_{i,j}, y_{i,j})$ to the border of the microimage area prevents staircase effect in color saturation of the re-focused images.

In one embodiment, the microimage area is only partially covered by the color filter array.

According to this particular CFA layout, the ratio corresponding to the number of recorded photons compared to the total number of photons is higher, since less pixels are covered by the CFA. Thus, the sensor is more sensitive to light compared to a CFA covering the whole sensor microimage.

In one embodiment, the color filter array only covers a 4*4 pixels area at the centroid of the microimage area.

According to this particular layout, each microlens image covers 50.26 pixels, and only 16 pixels receive less light. The sensor microimage collects a reduced number of photons from 16 pixels and all visible photons from the remaining pixels. Such a sensor therefore captured more than 84% of the photons, which is a significant improvement compared to CFA of the background art. As a matter of illustration, for a common Bayer pattern covering all the pixels, this ratio falls to about 50%.

In one particular embodiment of the technique, a method for determining at least one refocused image color component $R_x$ of a microimage area partially covered by a color filter array is disclosed. Such a method comprises:

determining a refocused image $R_{a,b}$ of the microimage area pixels covered by the color filter array, wherein the color saturation of the color filter array decreases when getting away from a centroid $(x_{i,j}, y_{i,j})$ of the microimage area;

determining a refocused image $R_T$ of the microimage area pixels not covered by the color filter array;

determining the color component $R_x$ by combining the refocused image $R_{am}$ and the refocused image $R_T$;

wherein determining the color component $R_x$ implements a weight on the refocused image $R_T$.

The implementation of such a weight has the advantage to distinguish photons suffering from larger optical aberrations versus photons less affected by the optical aberrations of the main lens. One person skilled in the art will understand that the expression "color component" refers to any color component of the implemented CFA. For instance, when considering a sensor covered by a Bayer filter, the color component to be determined can be the red, the green or the blue component.

In one particular embodiment of the technique, the present disclosure pertains a computer program product downloadable from a communication network and/or recorded on a medium readable by a computer and/or executable by a processor. Such a computer program product comprises program code instructions for implementing the method.

In one particular embodiment of the technique, the present disclosure pertains a non-transitory computer-readable carrier medium comprising a computer program product recorded thereon and capable of being run by a processor, including program code instructions for implementing the method.

While not explicitly described, the present embodiments may be employed in any combination or sub-combination.

4. BRIEF DESCRIPTION OF THE DRAWINGS

The present disclosure can be better understood with reference to the following description and drawings, given by way of example and not limiting the scope of protection, and in which.

Figure 5:
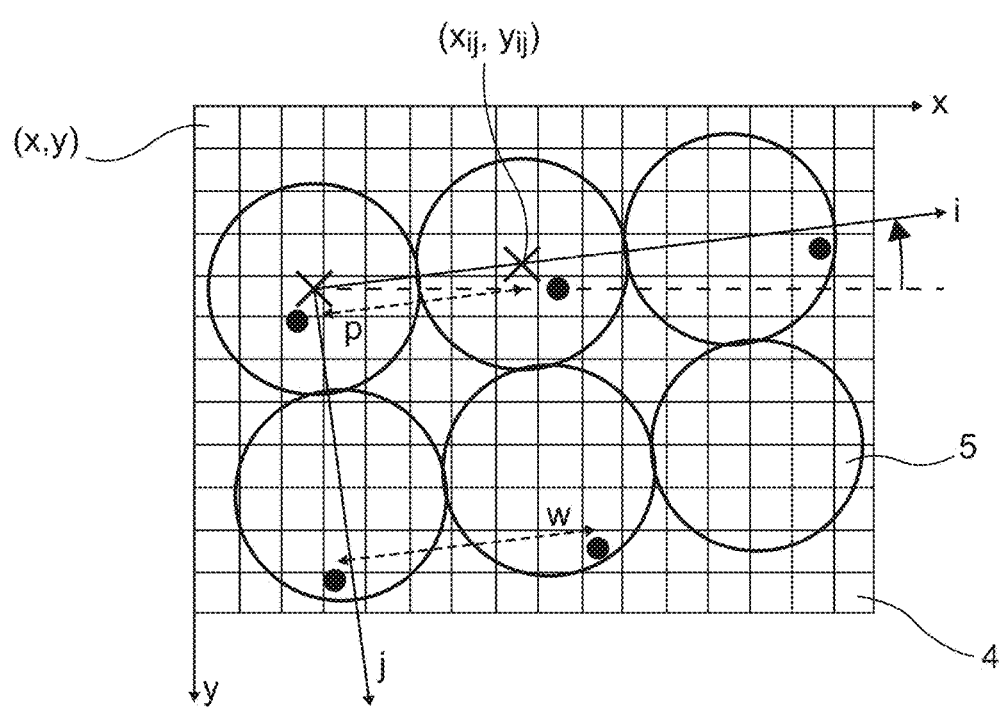
Figure 6:
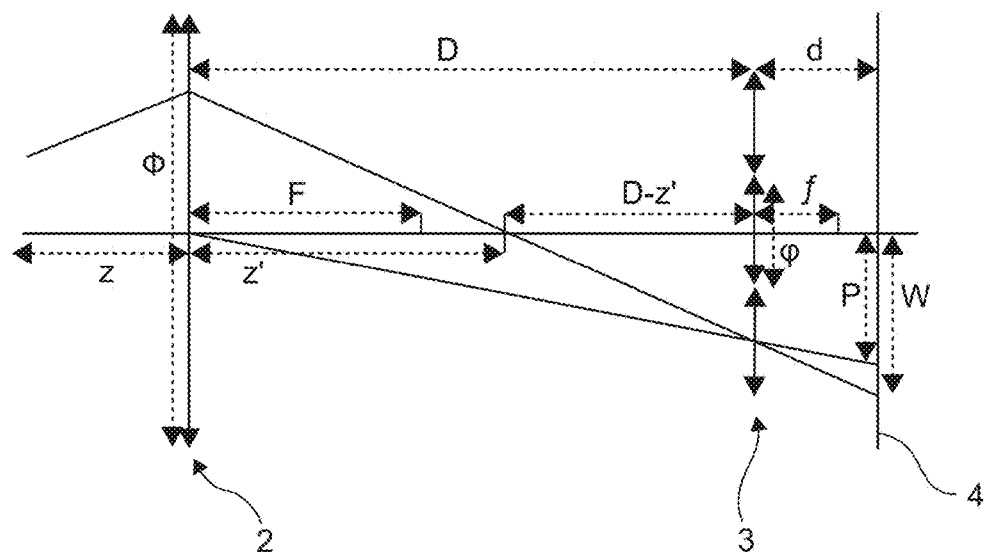
Figure 7:
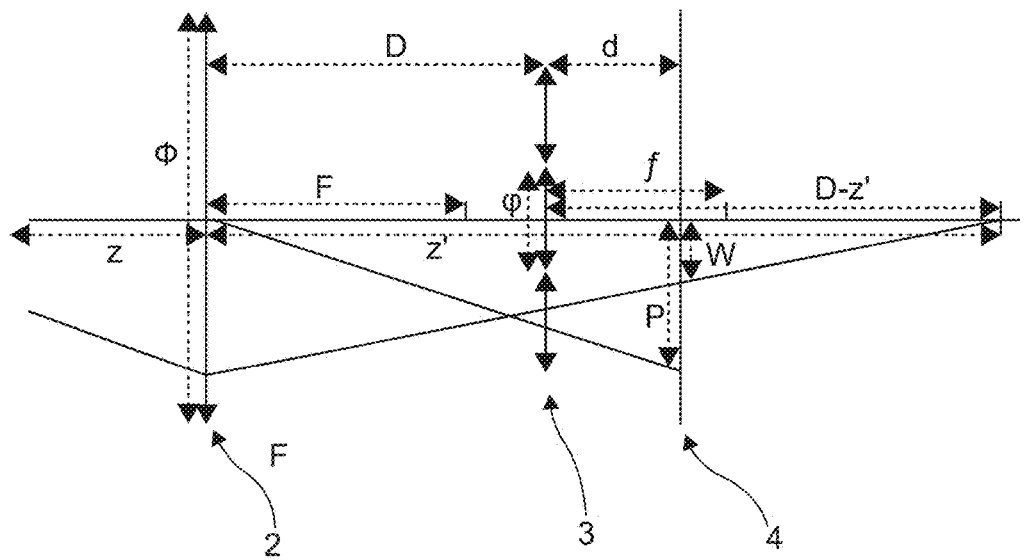
Figure 8:
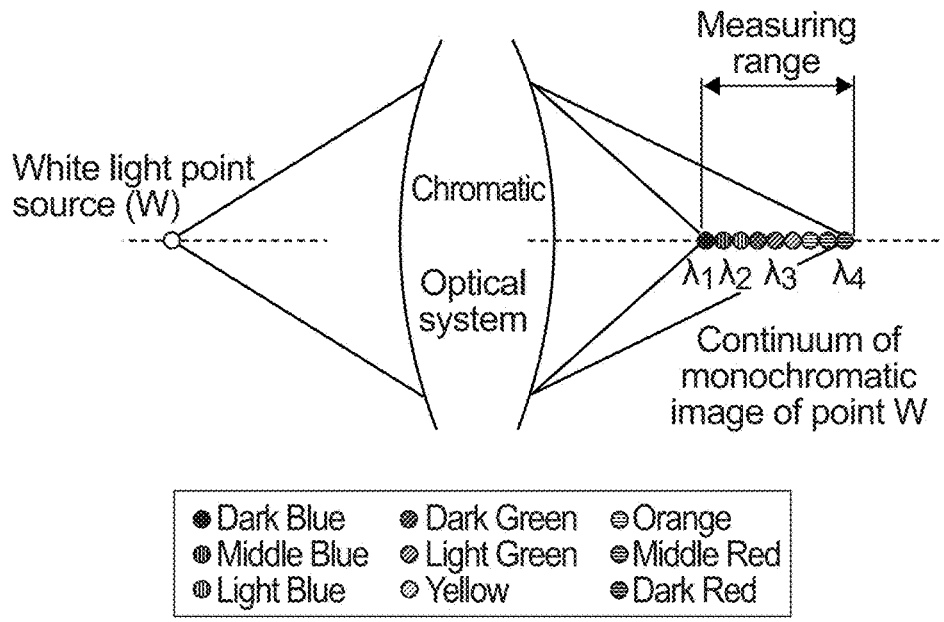
Figure 9:
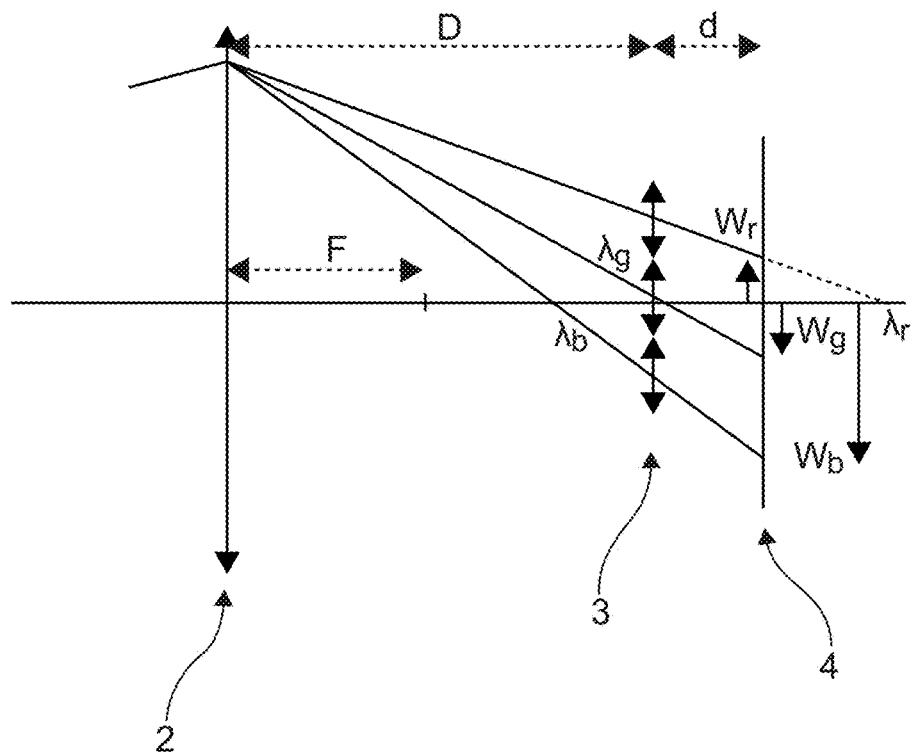
Figure 10:
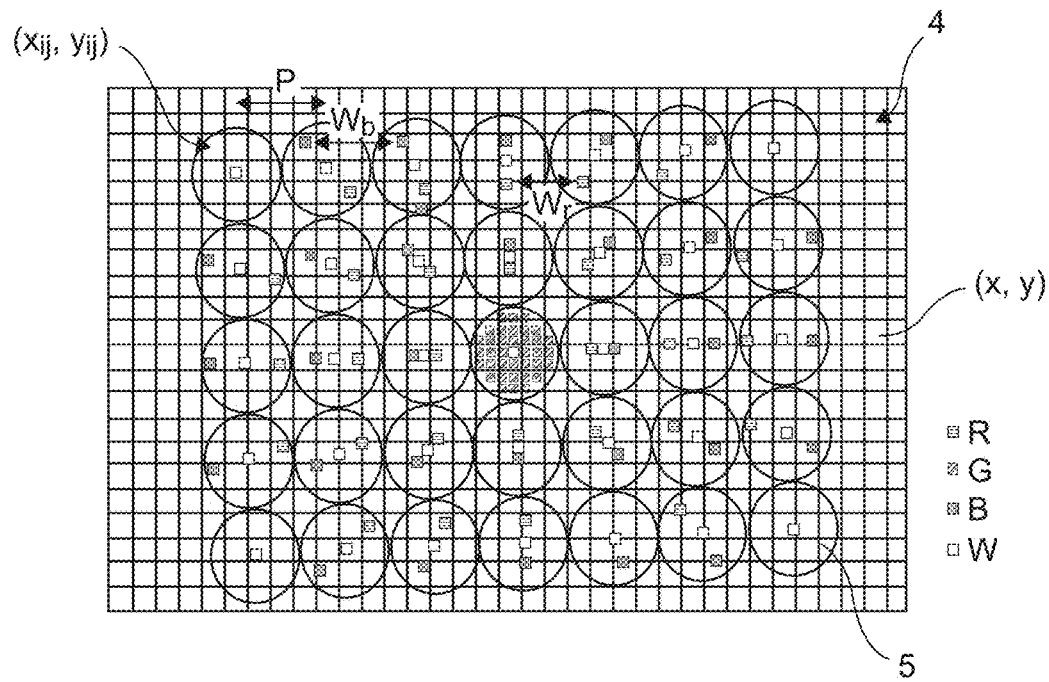
Figure 11:
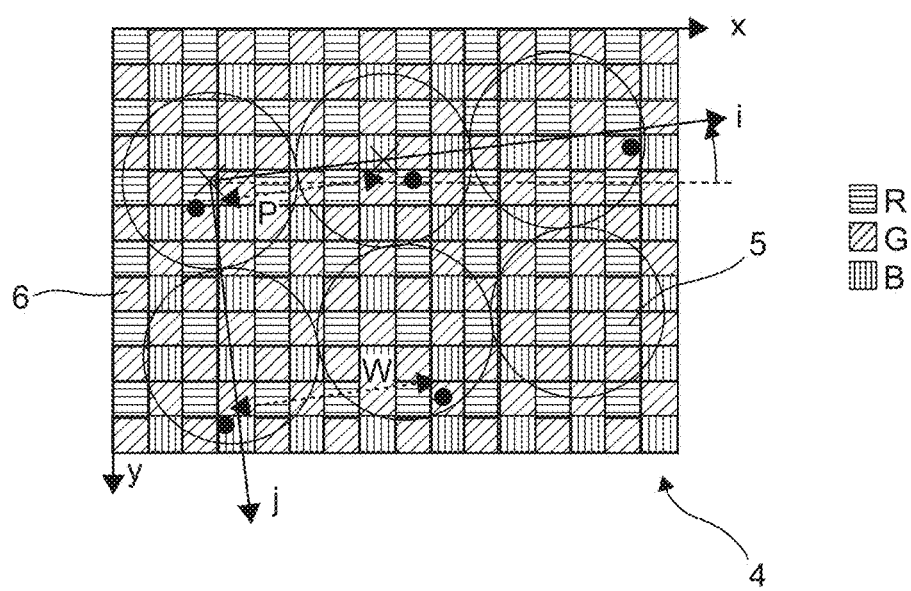
Figure 12:
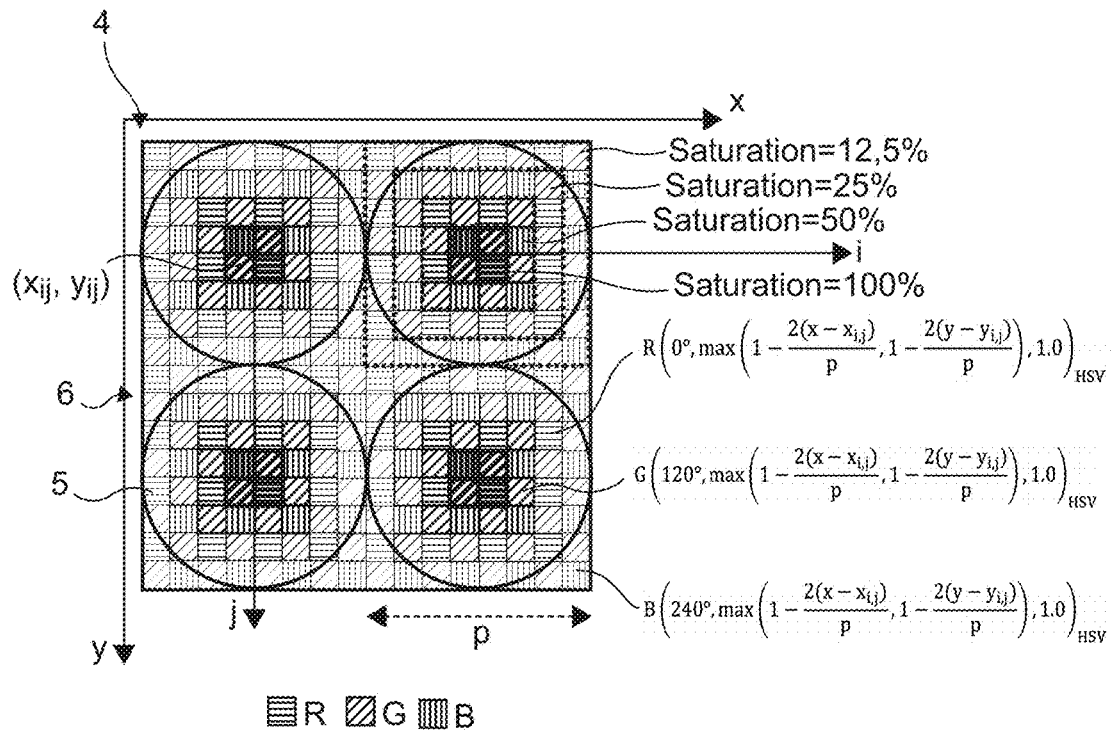
Figure 13:
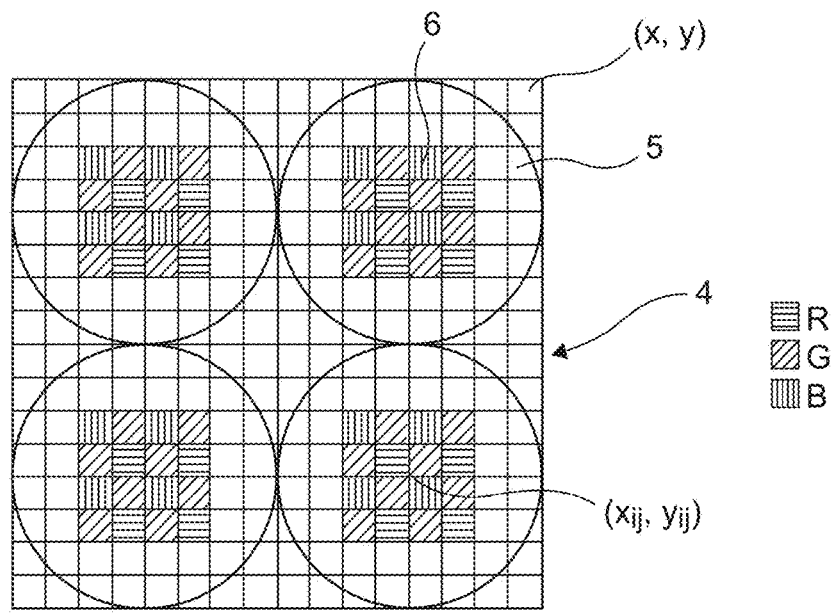
Figure 14:
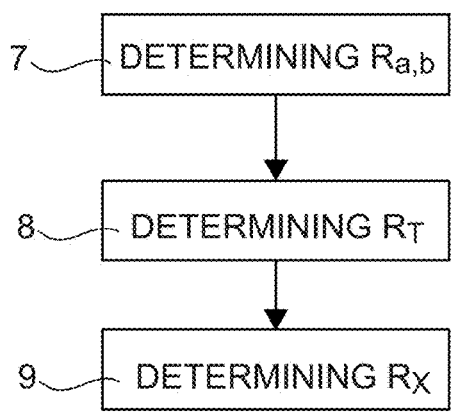
Figure 15:
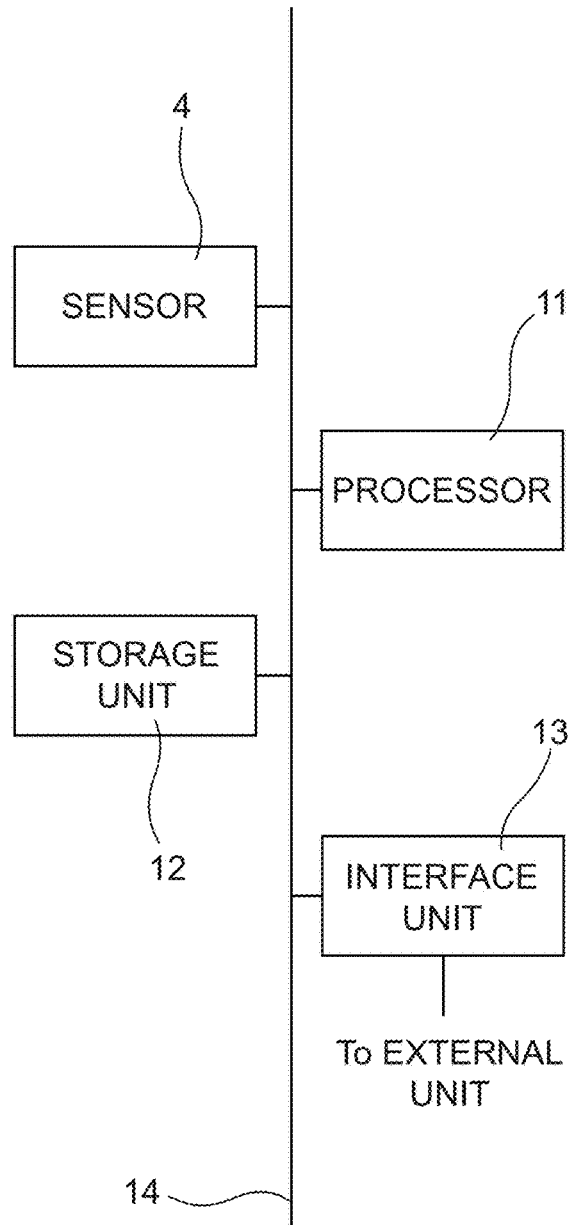

FIG. 5 is a schematic representation illustrating light-field data recorded by a sensor of a plenoptic camera, FIG. 6 is a schematic representation illustrating a plenoptic camera with W>P, FIG. 7 is a schematic representation illustrating a plenoptic camera with W<P, FIG. 8 is a schematic representation of the chromatic aberration phenomenon, FIG. 9 is a schematic representation illustrating a plenoptic camera, FIG. 10 is a schematic representation illustrating a light-field data recorded by a sensor of a plenoptic camera, for various rays wavelengths, FIG. 11 is a schematic representation illustrating a light-field data recorded by a sensor of a plenoptic camera, the sensor being covered by a Bayer filter, FIG. 12 is a schematic representation illustrating a light-field data recorded by a sensor of a plenoptic camera, according to one embodiment of the disclosure, FIG. 13 is a schematic representation illustrating a light-field data recorded by a sensor partially covered by a CFA, FIG. 14 is a flow chart of the successive steps implemented when performing a method according to one embodiment of the disclosure, and FIG. 15 is a schematic block diagram illustrating an apparatus for determining a refocused image color component, according to one embodiment of the disclosure.

The components in the figures are not necessarily to scale, emphasis instead being placed upon illustrating the principles of the disclosure.

5. DETAILED DESCRIPTION

General concepts and specific details of certain embodiments of the disclosure are set forth in the following description and in FIGS. 1 to 13 to provide a thorough understanding of such embodiments. One skilled in the art, however, will understand that the present disclosure may have additional embodiments, or may be practiced without several of the details described in the following description.

5.1 General Concepts

5.1.1 Color Filter Array

Figure 1:
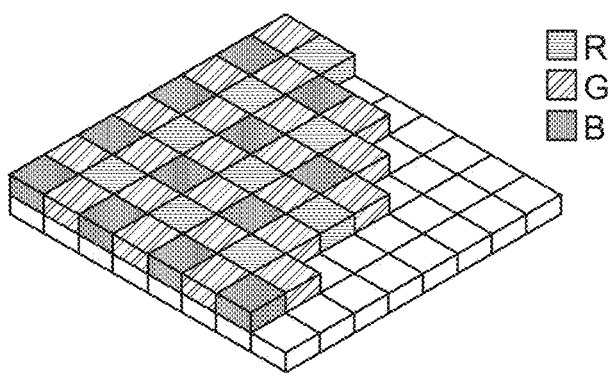
FIG. 1 is a schematic representation illustrating a common Bayer filter.

Color images are typically formed with three colors components per pixel. The common components are Red, Green and Blue, corresponding slightly to the color sensitivity of the eye. Unfortunately, most of the sensors record visible photons entering a pixel independently to photon wavelengths. To make a gray level sensor into a color capable sensor, a Color Filter Array (CFA) is commonly mounted on the sensor. The most common CFA is the so called Bayer pattern (filter) made of 2 by 2 pixels and replicated over the sensor as illustrated in FIG. 1.

The image recorded with a CFA is incomplete since only one color is recorded per pixel. The computation of the two other colors of a given pixel, in the case of the Bayer pattern, is done by interpolation, using the surrounding colors according to so-called de-mosaicking algorithms, as described in the patent document 1155506619A entitled "Adaptive color plan interpolation in single sensor color electronic camera". Such algorithms affect the image quality and may require heavy computation.

5.1.2 Notions Relative to RGB and HSV Color Spaces

Figure 2:
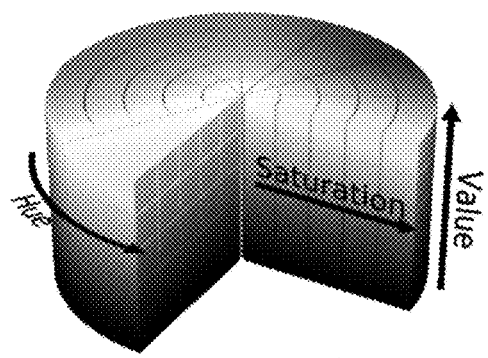
FIG. 2 is a schematic representation illustrating a HSV color space.

RGB (Red-Green-Blue) is a color space used to characterize the color of a pixel with three colors components. These three values can be converted into other color spaces as for instance the Hue Saturation Value (HSV) color space. The HSV space, as illustrated by FIG. 2, allows defining a color gradient from a pure color (a given hue, saturation and value set to maximum) to white (same hue, saturation set to 0, value set to maximum).

The conversion from RGB color space to HSV color space is performed by the following equation:

$$\Delta = \max(R, G, B) - \min(R, G, B)$$

$$\begin{cases} H = 4 + \dfrac{R - G}{\Delta} \\ S = \dfrac{V - \min(R, G, B)}{V} \\ V = \max(R, G, B) \end{cases}$$

The conversion from HSV to RGB color space is performed by:

$$H' = \frac{H}{60}$$

$$P = V(1 - S)$$

$$Q = V(1 - S\{H'\})$$

$$T = V(1 - S(1 - \{H'\}))$$

Where $\{H\}$ denotes the fractional part of H'. From the triplet (P, V, Q) one defines the value (R, G, B) depending on $I = \lfloor H' \rfloor$ the largest integer smaller than H'. (R, G, B)=(V, T, P) if I=0; (R, G, B)=(Q, V, P) if I=1; (R, G, B)=(P, V, T) if I=2; (R, G, B)=(P, Q, V) if I=3; (R, G, B)=(T, P, V) if I=4; (R, G, B)=(V, P, Q) if I=5.

The previous equations assumes that the three colors components are real numbers between 0 and 1. In return the components H and S are real numbers between 0 and 1 and H is a real number between 0 to 360 degrees.

Figure 3:
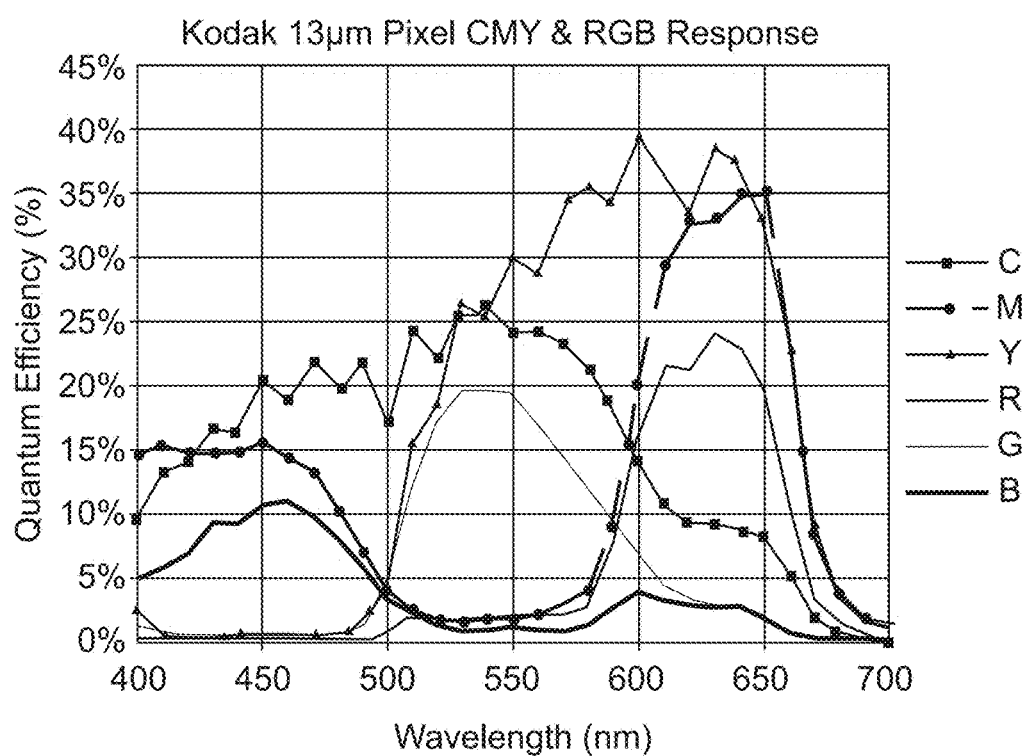
FIG. 3 is a diagram illustrating the pixel response for various color filters.

As pointed out here before, an important drawback of the CFA is that some photons are blocked by the color filters and consequently the sensitivity of the sensor is lowered down. For instance, with a Bayer pattern, at least half of the photons are lost in the filters. FIG. 3 illustrates how many photons are collected versus the total number of photons entering a pixel for various color filters of a Kodak™ sensor. The efficiency of the sensor is affected a lot by the color filters.

5.1.2 Description of a Plenoptic Camera

Figure 4:
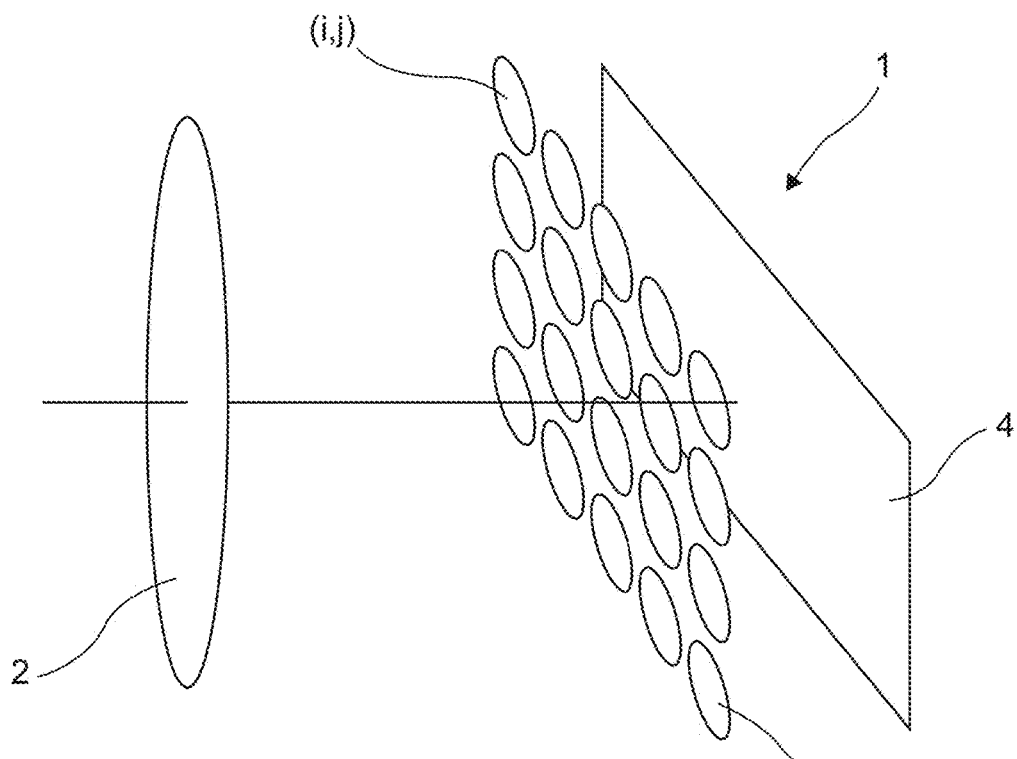
FIG. 4 is a schematic representation illustrating a plenoptic camera.

FIG. 4 illustrates a schematic plenoptic camera 1 made of a main lens 2, a microlens array 3, and a sensor 4. The main lens 2 receives light from a scene to be captured (not shown) in its object field and renders the light through a microlens array 3, which is positioned on the main lens image field. In one embodiment, this microlens array 3 includes a plurality of circular microlenses arranged in a two-dimensional (2D) array. In another embodiment, such microlenses have different shapes, e.g. elliptical, without departing from the scope of the disclosure. Each microlens has the lens properties to direct the light of a corresponding microimage to a dedicated area on the sensor 4: the sensor microimage 5.

In one embodiment, some spacers are located between the microlens array 3, around each lens, and the sensor 4, to prevent light from one lens to overlap with the light of other lenses at the sensor side.

5.1.3 4D Light-Field Data:

The image captured on the sensor 4 is made of a collection of 2D small images arranged within a 2D image. Each small image is produced by the microlens (i,j) from the microlens array 3. FIG. 5 illustrates an example of image recorded by the sensor 4. Each microlens (i,j) produces a microimage represented by a circle (the shape of the small image depends on the shape of the microlenses, which is typically circular). Pixel coordinates are labeled (x, y). p is the distance between two consecutive microimages 5. Microlenses (i, j) are chosen such that p is larger than a pixel size S. Microlens images areas 5 are referenced by their coordinates (i,j). Some pixels (x,y) might not receive any light from any microlens (i,j); those pixels (X) are discarded. Indeed, the inter microlens space is masked out to prevent photons to pass outside from a microlens (if the microlenses have a square shape, no masking is needed). The center $(x_{i,j}, y_{i,j})$ of a microlens image (i, j) is located on the sensor 4 at the coordinate $(x_{i,j}, y_{i,j})$. θ is the angle between the square lattice of pixel and the square lattice of microlenses. The $(x_{i,j}, y_{i,j})$ can be computed by the following equation considering $(x_{0,0}, y_{0,0})$ the pixel coordinate of the microlens image (0,0):

$$\begin{bmatrix} x_{i,j} \\ y_{i,j} \end{bmatrix} = p \begin{bmatrix} \cos\theta & -\sin\theta \\ \sin\theta & \cos\theta \end{bmatrix} \begin{bmatrix} i \\ j \end{bmatrix} + \begin{bmatrix} x_{0,0} \\ y_{0,0} \end{bmatrix} \quad (1)$$

This formulation assumes that the microlens array 3 is arranged following a square lattice. However, the present disclosure is not limited to this lattice and applies equally to hexagonal lattice or even non-regular lattices.

FIG. 5 also illustrates that an object from the scene is visible on several contiguous micro-lens images (dark dots). The distance between two consecutive views of an object is w, this distance is also referred to under the term "disparity".

5.1.4 Optical Property of the Light-Field Camera

The distances p and w introduced in the previous subsection are given in unit of pixel. They are converted into physical unit distance (meters) respectively P and W by multiplying by the pixel size δ:

$$W=\delta w \text{ and } P=\delta p$$

These distances depend on the light-field camera features.

FIG. 6 and FIG. 7 illustrate a schematic light-field assuming perfect thin lens model. The main-lens has a focal length F and an aperture Φ. The microlens array is made of microlenses having a focal length f. The pitch of the microlens array is φ. The microlens array is located at a distance D from the main-lens, and a distance d from the sensor. The object (not visible on the Figures) is located at a distance z from the main-lens (left). This object is focused by the main-lens at a distance z' from the main-lens (right). FIG. 6 and FIG. 7 illustrate the cases where respectively D>z' and D<z'. In both cases, microlens images can be in focus depending on d and f.

The disparity W varies with the distance z of the object.

5.1.5 Image Re-Focusing

A major property of the light-field camera is the possibility to compute 2D re-focused images where the re-focalization distance is freely adjustable. The 4D light-field data is projected into a 2D image by just shifting and zooming on micro-lens images and then summing them into a 2D image. The amount of shift controls the re-focalization distance. The projection of the 4D light field pixel (x, y, i, j) into the re-focused 2D image coordinate (X, Y) is defined by:

$$\begin{bmatrix} X \\ Y \end{bmatrix} = sg\left(\begin{bmatrix} x \\ y \end{bmatrix} - \begin{bmatrix} x_{i,j} \\ y_{i,j} \end{bmatrix}\right) + s\begin{bmatrix} x_{i,j} \\ y_{i,j} \end{bmatrix} \quad (2)$$

Where s controls the size of the 2D re-focused image, and g controls the focalization distance of the re-focused image.

5.1.6 Chromatic Aberration Issue

As illustrated by FIG. 8 the chromatic aberration issue comes from lens imperfections, which prevents focusing all colors of a point source in the same image plane.

When studying the impact of chromatic aberrations in a plenoptic camera system as illustrated by FIG. 9 and FIG. 10, we can observe that the variation of convergence plane depending on the wavelength translates into a variation of the disparity $W_r$, $W_g$, $W_b$ also depending on the wavelength.

In this matter, a skilled person is aware that the photons entering at the border of the main lens 2 are affected much more by chromatic aberrations than photons entering at the middle of the pupil. Now, the photons passing through the middle and the border of the main lens pupil are those respectively collected at the center $(x_{i,j}, y_{i,j})$ and the border of the sensor microimage 5. Thus, the photons collected at the border of the sensor microimage 5 are affected much more by chromatic aberrations than the photons collected nearby its center $(x_{i,j}, y_{i,j})$.

In other words the image quality of each microlens image varies from the center $(x_{i,j}, y_{i,j})$ to the border. The pixels at the center of the sensor microimages 5 bring sharper details and colors than the pixels located at the border of the sensor microimage 5.

5.1.6 CFA Mounted on a Plenoptic Camera

To record a colored 4D light-field, CFA is located on the sensor which records the 4D light-field. For instance, let assume that the CFA is made of M×M pixels of coordinate (a, b) with $(a,b) \in [0,M]^2$. The 4D light-field plus the color parameter become a 5D light-field (x, y, i, j, $c_{a,b}$) where $c_{a,b}$ is the color of the CFA coordinate (a, b). FIG. 11 illustrates a Bayer pattern (M=2) set on top of a sensor recording a 4D light-field.

The refocusing of the 5D light-field is performed with the equation (2), but applied independently to each color $c_{a,b}$ of the CFA. Thus one obtained $M^2$ refocused images $R_{a,b}$ which are then combined to compute the 3 color components of the RGB refocused images: $R_{red}$, $R_{green}$ and $R_{blue}$.

For instance in the case of the Bayer pattern M=2, $c_{0,0}$=Red, $c_{1,1}$=Blue, $c_{0,1}$=$c_{1,0}$=Green. The three color-components of the RGB refocused images are equal to $R_{red}$=$R_{0,0}$, $R_{green}$=$(R_{0,1}+R_{1,0})/2$ and $R_{blue}$=$R_{1,1}$.

5.2 Description of a First Embodiment of the Disclosure

FIG. 12 illustrates a sensor 4 according to one embodiment of the disclosure. This sensor 4 can be mounted on a plenoptic camera 1, comprises a plurality of microimage areas 5, each of them being covered by a CFA 6.

The sensor 4 is of a CCD (Charge-Coupled Device) type using a CMOS (Complementary Metal Oxide Semiconductor) technology. However, one skilled in the art will understand that such a sensor 4 may alternatively embody a neuromorphic spike based sensor (e.g. Artificial Silicon Retina) or any other type of photo-sensor known from the background art.

The CFA 6 as illustrated by FIG. 12 is a Bayer filter. However, one skilled in the art will understand that such a CFA 6 may alternatively embody a RGBE filter, a CYYM filter, or any other type of CFA known from the background art, without departing from the scope of disclosure.

In one embodiment of the disclosure, the color saturation of the CFA 6 is decreasing from the center (X) to the border of the sensor microimage 5. The upper section of FIG. 12 illustrates such a reduction of the color saturation, with a color saturation set to 100%, 50%, 25% and 12.5% for pixels that are respectively located at the center $(x_{i,j}, y_{i,j})$ and at one, two, and three pixels away from the center $(x_{i,j}, y_{i,j})$.

In another embodiment of the disclosure, and as illustrated by the lower section of FIG. 12, the saturation of the colors are given according to a function f which returns a value between [0.0, 1.0] and decreases from f(d=0) to f(p/2)

$$\begin{cases} R(0°, f(d), 1.0)_{HSV} \\ G(120°, f(d), 1.0)_{HSV} \\ B(240°, f(d), 1.0)_{HSV} \end{cases}$$

In this particular embodiment, the saturation of the colors varies linearly from 1 at the center $(x_{i,j}, y_{i,j})$ of sensor microimage 5 to 0 at its border. The color components are given is HSV color space:

$$\begin{cases} R\left(0°, \max\left(1 - \frac{2(x - x_{i,j})}{p}, 1 - \frac{2(y - y_{i,j})}{p}\right), 1.0\right)_{HSV} \\ G\left(120°, \max\left(1 - \frac{2(x - x_{i,j})}{p}, 1 - \frac{2(y - y_{i,j})}{p}\right), 1.0\right)_{HSV} \\ B\left(240°, \max\left(1 - \frac{2(x - x_{i,j})}{p}, 1 - \frac{2(y - y_{i,j})}{p}\right), 1.0\right)_{HSV} \end{cases}$$

Such a smooth variation in saturation from the center $(x_{i,j}, y_{i,j})$ to the border of the microimage area 5 prevents staircase effect in color saturation of the re-focused images.

The decrease of saturation in this CFA allows capturing more photons than a common Bayer filter, therefore improving the light sensitivity of the sensor 4. In addition, since the pixels at the center $(x_{i,j}, y_{i,j})$ are illuminated by photons that are less aberrated compared to photons passing by the main lens pupil border, such a sensor 4 allows limiting the risk of chromatic aberration appearance, while keeping satisfactory color sensitivity.

5.3 Description of a Second Embodiment of the Disclosure

According to a second embodiment of the disclosure, the CFA 6 is applied only on a fraction of the sensor microimage 5. FIG. 13 illustrates a 4D light-field captured by a plenoptic camera 1 with a micro-lens array 3 having a square lattice and a pitch $\varphi = 8\delta$ (8 pixels). The Bayer pattern is replicated only on the 4×4 pixels at the center $(x_{i,j}, y_{i,j})$ of each sensor microimage 5. The diameter of the micro-lens image p is equal to $p = \varphi(D+d)/D$. But since $(D+d)/D$ is very close to 1.0 one could consider that the diameter of the micro-lens images is given by the pitch of the micro-lens array.

This particular design allows the sensor 4 being more sensitive to light compared to a CFA 6 covering the totality of the sensor microimage 5.

As a matter of illustration, a sensor 4 according to the second embodiment, but with a constant color saturation of the CFA 6, as illustrated by FIG. 13, is tested in operational conditions. For such a sensor 4, each microlens image covers 50.26 pixels, and only 16 pixels (i.e. the 4×4 pixels covered by the Bayer pattern) receive a reduced amount of light. The sensor microimage 5 collects half of the photons from 16 pixels and all visible photons from the remaining pixels. The number of recorded photons compared to the total number of photons is (50.26−16*0.5)/50.26=84%. This ratio is larger than the typical 50% of a Bayer pattern covering all pixels.

One person skilled in the art will understand that in the case of a sensor 4 according to the second embodiment, with a color saturation of CFA decreasing from the center $(x_{i,j}, y_{i,j})$ to the border of the sensor microimage 5, the ratio corresponding to the number of recorded photons compared to the total number of photons is significantly higher, improving furthermore the light sensitivity of the sensor 4.

5.4 Computing a RGB Re-Focused Image

The following paragraph pertains to a sensor 4 according to the second embodiment of the disclosure. One person skilled in the art will understand that such implementations can be applied on a sensor 4 according to the first embodiment of the disclosure, without departing from the scope of disclosure.

Now considering a sensor 4 according to the second embodiment of the disclosure, it is possible to compute $M^2$ refocused images $R_{a,b}$ corresponding to the $M^2$ filters of the CFA pattern plus a single refocus image $R_T$ corresponding to the pixels not covered by a color filter 6.

Several methods can be used to convert the $M^2$ refocused images $R_{a,b}$ and the $R_T$ refocused image into the 3 color components: $R_{red}$, $R_{green}$ and $R_{blue}$ of the refocused image. For instance in the case of the Bayer pattern M=2, $c_{0,0}$=Red, $c_{1,1}$=Blue, $c_{1,0}=c_{1,0}$=Green. The three color components of the RGB refocused images can be computed by $R_{red}=(R_{0,0}+R_T)/2$, $R_{green}=(R_{0,1}/2+R_{1,0}/2+R_T)/2$ and $R_{red}=(R_{1,1}+R_T)/2$. Obviously, other combinations could be used without departing from the scope of disclosure.

As illustrated by FIG. 14, this method according to one embodiment of this disclosure, comprises:
  determining 7 a refocused image $R_{am}$ of the microimage area pixels (i,j) covered by the color filter array 6,
  determining 8 a refocused image $R_T$ of the microimage area pixels (i,j) not covered by the color filter array 6,
  determining 9 the color component $R_x$ by combining the refocused image $R_{a,b}$ and the refocused image $R_T$.

Determining $R_x$ 9 implements a weight (W) on the refocused image $R_T$.

One person skilled in the art will understand that the expression "color component" refers to any color component of the implemented CFA. For instance, when considering a sensor covered by a Bayer filter, the color component to be determined can be the red $R_r$, the green $R_g$ or the blue $R_b$ component.

The $R_T$ refocused image has a lower image quality than the other $R_{a,b}$ refocused images since it collects photons being more affected by the optical aberrations of the main lens 2. To take into consideration this image property, the values of $R_T$ with $R_{a,b}$ are mixed depending on the local contrast. For instance: the weight (W) of the $R_T$ relative to the $R_{a,b}$ is lowered around textures identified locally on the $R_{a,b}$.

The implementation of such a weight W of the $R_T$ relative to the $R_{a,b}$ to the combination of $R_{a,b}$ and $R_T$ has the advantage to distinguish photons suffering from larger optical aberrations versus photons less affected by the optical aberrations of the main lens.

FIG. 15 is a schematic block diagram illustrating an example of an apparatus 10 for determining at least one refocused image color component $R_x$ of a microimage area 5 partially covered by a color filter array 6, according to an embodiment of the present disclosure. Such an apparatus 10 includes a processor 11, a storage unit 12, an interface unit 13 and a sensor 4, which are connected by a bus 14. Of course, constituent elements of the computer apparatus 10 may be connected by a connection other than a bus connection using the bus 14.

The processor 11 controls operations of the apparatus 10. The storage unit 12 stores at least one program to be executed by the processor 11, and various data, including data of plenoptic images, parameters used by computations performed by the processor 11, intermediate data of computations performed by the processor 11, and so on. The processor 11 may be formed by any known and suitable hardware, or software, or by a combination of hardware and software. For example, the processor 11 may be formed by dedicated hardware such as a processing circuit, or by a programmable processing unit such as a CPU (Central Processing Unit) that executes a program stored in a memory thereof.

The storage unit 12 may be formed by any suitable storage or means capable of storing the program, data, or the like in a computer-readable manner. Examples of the storage unit 12 include non-transitory computer-readable storage media such as semiconductor memory devices, and magnetic, optical, or magneto-optical recording media loaded into a read and write unit. The program causes the processor 11 to perform a process for determining at least one refocused image color component $R_x$ of a microimage area 5 partially covered by a color filter array 6, according to an embodiment of the present disclosure as described above with reference to FIG. 14.

The interface unit 13 provides an interface between the apparatus 10 and an external apparatus. The interface unit 13 may be in communication with the external apparatus via cable or wireless communication. In this embodiment, the external apparatus may be a plenoptic camera. In this case, plenoptic images can be input from the plenoptic camera to the apparatus 10 through the interface unit 13, and then stored in the storage unit 12.

The apparatus 10 and the plenoptic camera may communicate with each other via cable or wireless communication.

Although only one processor 11 is shown on FIG. 15, a skilled person will understand that such a processor may comprise different modules and units embodying the functions carried out by the apparatus 10 according to embodiments of the present disclosure, such as:

A module for determining a refocused image $R_{a,b}$ of the microimage area pixels (i,j) covered by the color filter array 6;

A module for determining a refocused image $R_T$ of the microimage area pixels (i,j) not covered by the color filter array 6;

A module for determining the color component $R_x$ by combining the refocused image $R_{a,b}$ and the refocused image $R_T$.

These modules may also be embodied in several processors 9 communicating and co-operating with each other.

As will be appreciated by one skilled in the art, aspects of the present principles can be embodied as a system, method or computer readable medium. Accordingly, aspects of the present principles can take the form of an entirely hardware embodiment, an entirely software embodiment (including firmware, resident software, microcode, and so forth), or an embodiment combining software and hardware aspects.

When the present principles are implemented by one or several hardware components, it can be noted that a hardware component comprises a processor that is an integrated circuit such as a central processing unit, and/or a microprocessor, and/or an Application-specific integrated circuit (ASIC), and/or an Application-specific instruction-set processor (ASIP), and/or a graphics processing unit (GPU), and/or a physics processing unit (PPU), and/or a digital signal processor (DSP), and/or an image processor, and/or a coprocessor, and/or a floating-point unit, and/or a network processor, and/or an audio processor, and/or a multi-core processor. Moreover, the hardware component can also comprise a baseband processor (comprising for example memory units, and a firmware) and/or radio electronic circuits (that can comprise antennas), which receive or transmit radio signals. In one embodiment, the hardware component is compliant with one or more standards such as ISO/IEC 18092/ECMA-340, ISO/IEC 21481/ECMA-352, GSMA, StoLPaN, ETSI/SCP (Smart Card Platform), GlobalPlatform (i.e. a secure element). In a variant, the hardware component is a Radio-frequency identification (RFID) tag. In one embodiment, a hardware component comprises circuits that enable Bluetooth communications, and/or Wi-fi communications, and/or Zigbee communications, and/or USB communications and/or Firewire communications and/or NFC (for Near Field) communications.

Furthermore, aspects of the present principles can take the form of a computer readable storage medium. Any combination of one or more computer readable storage medium(s) may be utilized.

Thus for example, it will be appreciated that any flow charts, flow diagrams, state transition diagrams, pseudo code, and the like represent various processes which may be substantially represented in computer readable storage media and so executed by a computer or a processor, whether or not such computer or processor is explicitly shown.

Although the present disclosure has been described with reference to one or more examples, a skilled person will recognize that changes may be made in form and detail without departing from the scope of the disclosure and/or the appended claims.

The invention claimed is:

1. A sensor targeted to be mounted on a plenoptic camera, the sensor comprising:
    at least one microimage area targeted to sense a microimage refracted by a microlens array, wherein the microimage area is only partially covered by a color filter array, wherein the color saturation of the color filter array decreases when getting away from a centroid $(x_{i,j}, y_{i,j})$ of the microimage area, and wherein the color filter array only covers a 4*4 pixels area at the centroid $(x_{i,j}, y_{i,j})$ of the microimage area.

2. The sensor according to claim 1, wherein the centroid of the color filter array corresponds to the centroid $(x_{i,j}, y_{i,j})$ of the microimage area.

3. The sensor according to claim 1, wherein the color saturation of the color filter array decreases from the centroid $(x_{i,j}, y_{i,j})$ of the microimage area to the border of the microimage area.

4. The sensor according to claim 1, wherein the color saturation of the color filter array varies from 1 at the centroid $(x_{i,j}, y_{i,j})$ of the microimage area to 0 nearby the border of the microimage area.

5. The sensor according to claim 4, wherein the color filter array is a Bayer filter and the color components are given in HSV color space:

$$\begin{cases} R\left(0°, \max\left(1 - \frac{2(x-x_{i,j})}{p}, 1 - \frac{2(y-y_{i,j})}{p}\right), 1.0\right)_{HSV} \\ G\left(120°, \max\left(1 - \frac{2(x-x_{i,j})}{p}, 1 - \frac{2(y-y_{i,j})}{p}\right), 1.0\right)_{HSV} \\ B\left(240°, \max\left(1 - \frac{2(x-x_{i,j})}{p}, 1 - \frac{2(y-y_{i,j})}{p}\right), 1.0\right)_{HSV} \end{cases}$$

where (x, y) are the coordinates of a pixel below the microlens (i,j), $(x_{i,j}, y_{i,j})$ are the coordinates of the centroid of the microlens image area and p is the distance between the respective centers $(x_{i,j}, y_{i,j})$ of two adjacent microimage areas.

6. A method for determining at least one refocused image color component $R_x$ of a microimage area partially covered by a color filter array, comprising:
    determining a refocused image $R_{a,b}$ of microimage area pixels (i,j) covered by the color filter array, wherein the color saturation of the color filter array decreases when getting away from a centroid $(x_{i,j}, y_{i,j})$ of the microimage area;

determining a refocused image $R_T$ of the microimage area pixels (i,j) not covered by the color filter array;

determining the color component $R_x$ by combining the refocused image $R_{a,b}$ and the refocused image $R_T$;

wherein determining implements a weight (W) on the refocused image $R_T$.

7. A light-field data acquisition device comprising a sensor, the sensor comprising:

at least one microimage area targeted to sense a microimage refracted by a microlens array, wherein the microimage area is only partially covered by a color filter array, wherein the color saturation of the color filter array decreases when getting away from a centroid $(x_{i,j}, y_{i,j})$ of the microimage area, and wherein the color filter array only covers a 4*4 pixels area at the centroid $(x_{i,j}, y_{i,j})$ of the microimage area.

8. A non-transitory computer-readable medium comprising a computer program product recorded thereon and capable of being run by a processor, including program code instructions for implementing a method according to claim 6.

* * * * *